United States Patent [19]
Newman et al.

[11] Patent Number: 5,978,394
[45] Date of Patent: Nov. 2, 1999

[54] WAVELENGTH SYSTEM FOR AN EXCIMER LASER

[75] Inventors: Peter C. Newman; Richard L. Sandstrom, both of Encinitas, Calif.

[73] Assignee: Cymer, Inc., San Diego, Calif.

[21] Appl. No.: 09/165,593

[22] Filed: Oct. 2, 1998

Related U.S. Application Data

[63] Continuation-in-part of application No. 09/041,474, Mar. 11, 1998.

[51] Int. Cl.⁶ .................................................... H01S 3/13
[52] U.S. Cl. ................................ 372/32; 372/20; 372/57; 372/60; 372/12
[58] Field of Search ................................ 372/32, 20, 57, 372/60, 19

[56] References Cited

U.S. PATENT DOCUMENTS

| | | |
|---|---|---|
| 4,823,354 | 4/1989 | Znotins et al. . |
| 5,015,099 | 5/1991 | Nagai et al. . |
| 5,025,445 | 6/1991 | Anderson et al. . |
| 5,420,877 | 5/1995 | Sandstrom et al. . |
| 5,450,207 | 9/1995 | Fomenkov . |
| 5,748,656 | 5/1998 | Watson et al. ............................. 372/57 |
| 5,764,678 | 6/1998 | Tada ......................................... 372/57 |
| 5,780,843 | 7/1998 | Cliche et al. . |
| 5,802,094 | 9/1998 | Wakabayashi et al. ................... 372/57 |
| 5,835,520 | 11/1998 | Das et al. .................................. 372/57 |
| 5,856,911 | 1/1999 | Ershov ..................................... 372/57 |

*Primary Examiner*—Leon Scott, Jr.
*Attorney, Agent, or Firm*—John R. Ross, Esq.

[57] ABSTRACT

A wavelength system for measuring and controlling the wavelength of a narrowband laser. The system includes a wavemeter for measuring incremental changes in wavelength and an atomic wavelength reference for calibrating the wavemeter. The atomic wavelength reference includes a vapor cell for providing a vapor having at least one absorption line near a desired operating wavelength. The system includes a wavelength tuning device with a tuning range sufficient to tune the laser to operate at the wavelength of the absorption line in order to calibrate the wavemeter.

In a preferred embodiment, the laser is an ArF laser, and the vapor is platinum and the absorption line is either 193,224.3 pm or 193,436.9. Improvements over prior art devices include an improved etalon having a support flange to provide a low stress three-point hanging support for the etalon without use of elastomers.

13 Claims, 12 Drawing Sheets

PDA OUTPUT SHOWING ETALON FRINGES

WAVELENGTH SYSTEM FOR AN EXCIMER LASER

This application is a continuation-in-part of Ser. No. 09/041,474 filed Mar. 11, 1998.

FIELD OF THE INVENTION

This invention relates to lasers and, in particular, to a technique for accurately calibrating the output wavelength tuning of an excimer laser.

BACKGROUND

Various methods are well known for wavelength tuning of lasers. Typically the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded and directed to a grating which reflects a narrow selected portion of the laser's broader spectrum back into the discharge chamber where it is amplified. The laser is typically tuned by changing the angle at which the beam illuminates the grating. This may be done by adjusting the position of the grating or providing a mirror adjustment in the beam path. The adjustment of the grating position or the mirror position may be made by a mechanism which we will refer to as a wavelength adjustment mechanism. For many applications it is important that the laser not only be finely tunable but also that the wavelength of the beam be set to a precise absolute value, with a very small deviation, such as for example 193.3500 nm±0.0001 nm. This requires very precise calibration of the wavelength adjustment mechanism.

Wavelength measurements are typically made using gratings and/or etalons which disperse a laser beam spectrally to produce a spatial intensity distribution which is a function of wavelength. These devices are typically able to determine only changes in wavelength; therefore, in order for these devices to be used to measure absolute wavelengths they must be calibrated using a known reference wavelength.

U.S. Pat. No. 5,450,207, entitled "Method and Apparatus for Calibrating a Laser Wavelength Control Mechanism," by Igor Fomenkov, assigned to the present assignee and incorporated herein by reference, describes a method for calibrating a wavelength adjustment mechanism for a KrF excimer laser. In the '207 patent, a small portion of the light emitted by a laser is passed through a cell containing FeNe vapor, used as an absorption gas. The light exiting this vapor is then detected by a photodetector, and the intensity of the detected light is then analyzed. The FeNe vapor absorbs a portion of the laser light at a wavelength of 248.3271 nm. The laser has a tunable range between 247.9 nm to 248.7 nm. The wavelength of the beam can be tuned anywhere in the range by pivoting a tuning mirror. One or more dips in the intensity of the laser light passing through the vapor as the mirror is slewed through a range of angles are detected and used to calibrate the laser wavelength measuring system (hereinafter called wavemeter). The wavemeter, once calibrated, may then accurately measure the absolute wavelength of laser light at other wavelengths. Such a wavemeter is described in U.S. Pat. No. 5,025,445, assigned to the present assignee and incorporated herein by reference.

The National Institute of Standards and Technology has published emission lines of platinum at 193,224.33 pm and 193,436.9 pm.

If the laser is used in a stepper in a wafer fabrication system, the stepper optics and the fabrication process are optimized for a specific laser wavelength. Accordingly, it is important that the laser wavelength be adjusted accurately so that a maximum amount of the laser energy occurs at the desired wavelength.

What is needed is a better device for measuring and controlling the wavelength of an ArF excimer laser.

SUMMARY OF THE INVENTION

The present invention provides a wavelength system for measuring and controlling the wavelength of a narrowband laser. The system includes a wavemeter for measuring incremental changes in wavelength and an atomic wavelength reference for calibrating the wavemeter. The atomic wavelength reference includes a vapor cell for providing a vapor having at least one absorption line near a desired operating wavelength. The system includes a wavelength tuning device with a tuning range sufficient to tune the laser to operate at the wavelength of the absorption line in order to calibrate the wavemeter.

In a preferred embodiment, the laser is an ArF laser, the vapor is platinum and the absorption line is either 193,224.3 pm or 193,436.9. Improvements over prior art devices include an improved etalon having a support flange to provide a low stress three-point hanging support for the etalon without use of elastomers.

The preferred embodiment includes a grating based coarse wavelength measurement and an etalon based fine measurement, both of which produce wavelength indicating optical signals on a single photo diode array.

The invention provides a technique for measuring and controlling the absolute wavelength of a narrowband ArF excimer laser utilizing the coarse and fine measurement and the platinum reference.

DETAILED DESCRIPTION OF PREFERRED EMBODIMENTS

ArF Natural Spectrum

Figure 1:
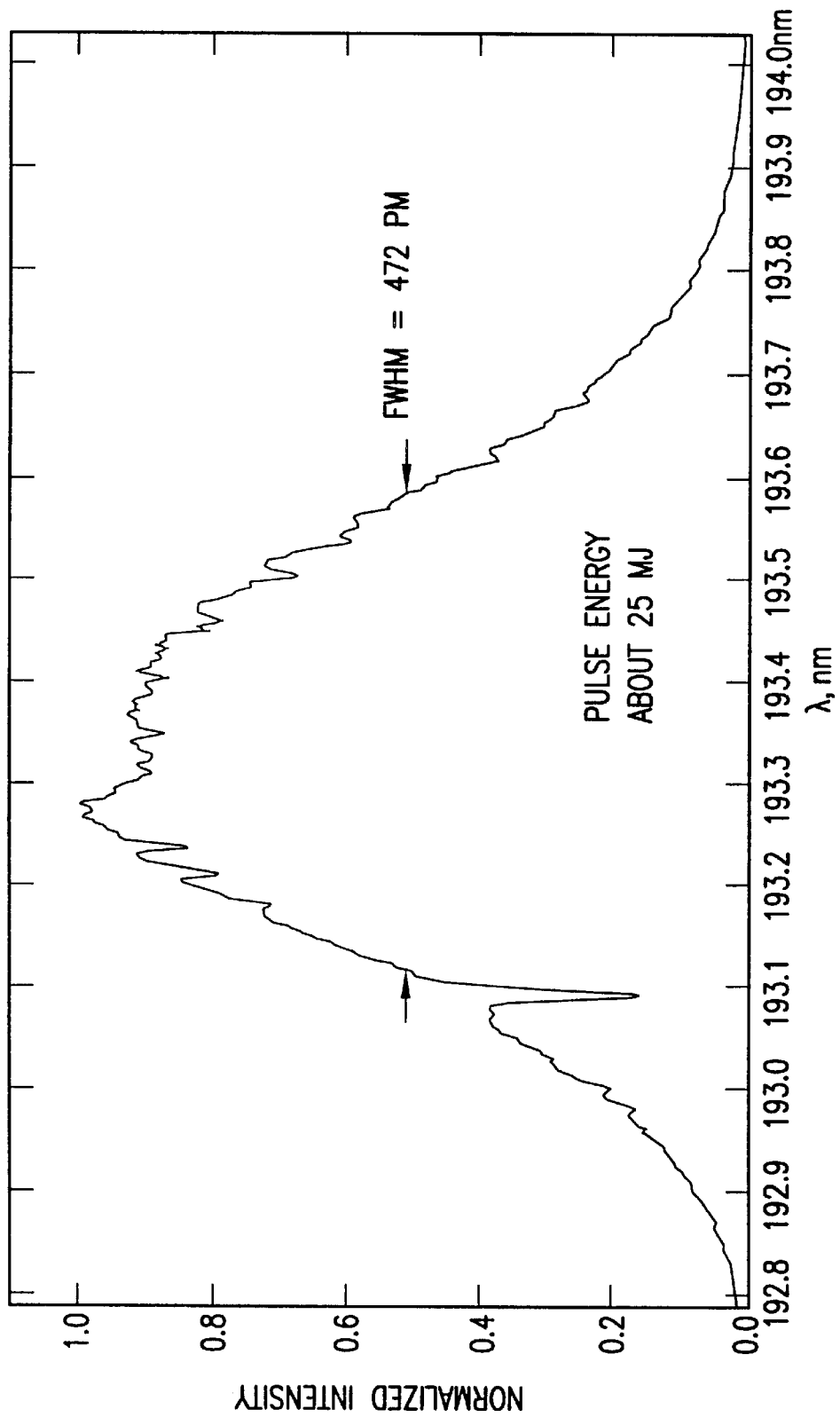
FIG. 1 is a graph of an ArF excimer laser broadband spectrum.

FIG. 1 shows the approximate natural broadband spectrum of a high pulse rate ArF excimer laser. As shown in FIG. 1, the FWHM bandwidth is about 472 pm. This particular laser may be operated at a rate of up to 1000 Hz, and the typical pulse energy is about 25 mJ per pulse. This broadband spectrum is generally not useful for integrated circuit lithography which typically requires bandwidths of less than 1.0 pm.

ArF Narrowband Spectrum

Figure 2:
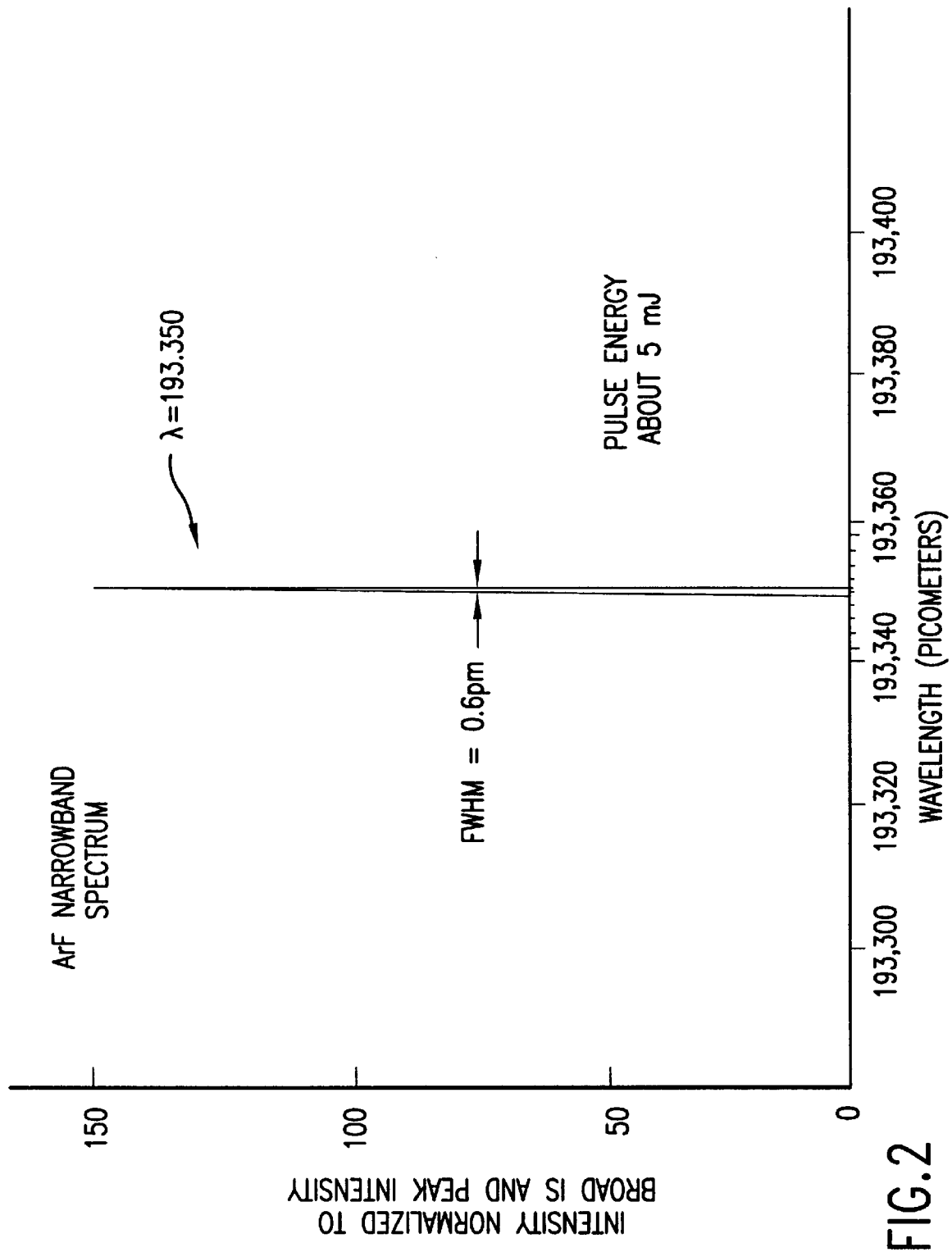
FIG. 2 is an ArF narrowband spectrum.

The laser may be narrow banded, using well known prior art techniques. Narrowbanding produces an output spectrum such as that shown in FIG. 2. In this case the FWHM bandwidth is greatly reduced (by a factor of almost 800) to about 0.6 pm, and the pulse energy is reduced (by a factor of about 5) to about 5 mJ. As a result, the intensity of the pulse at the desired narrow band is very greatly increased as indicated in FIG. 2.

Figure 3:
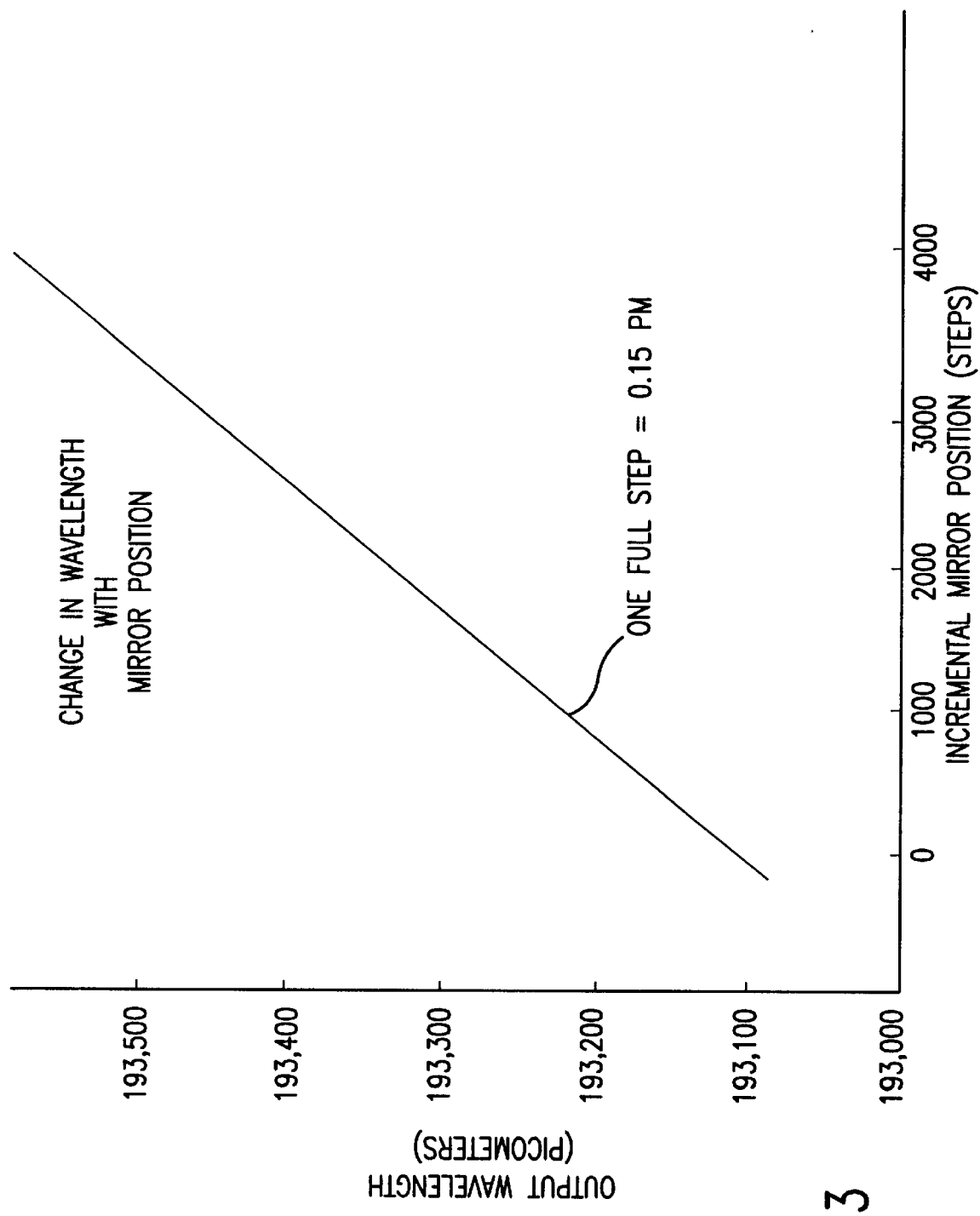
FIG. 3 shows the relationship between tuning mirror position and output wavelength for an ArF excimer laser.
Figure 4:
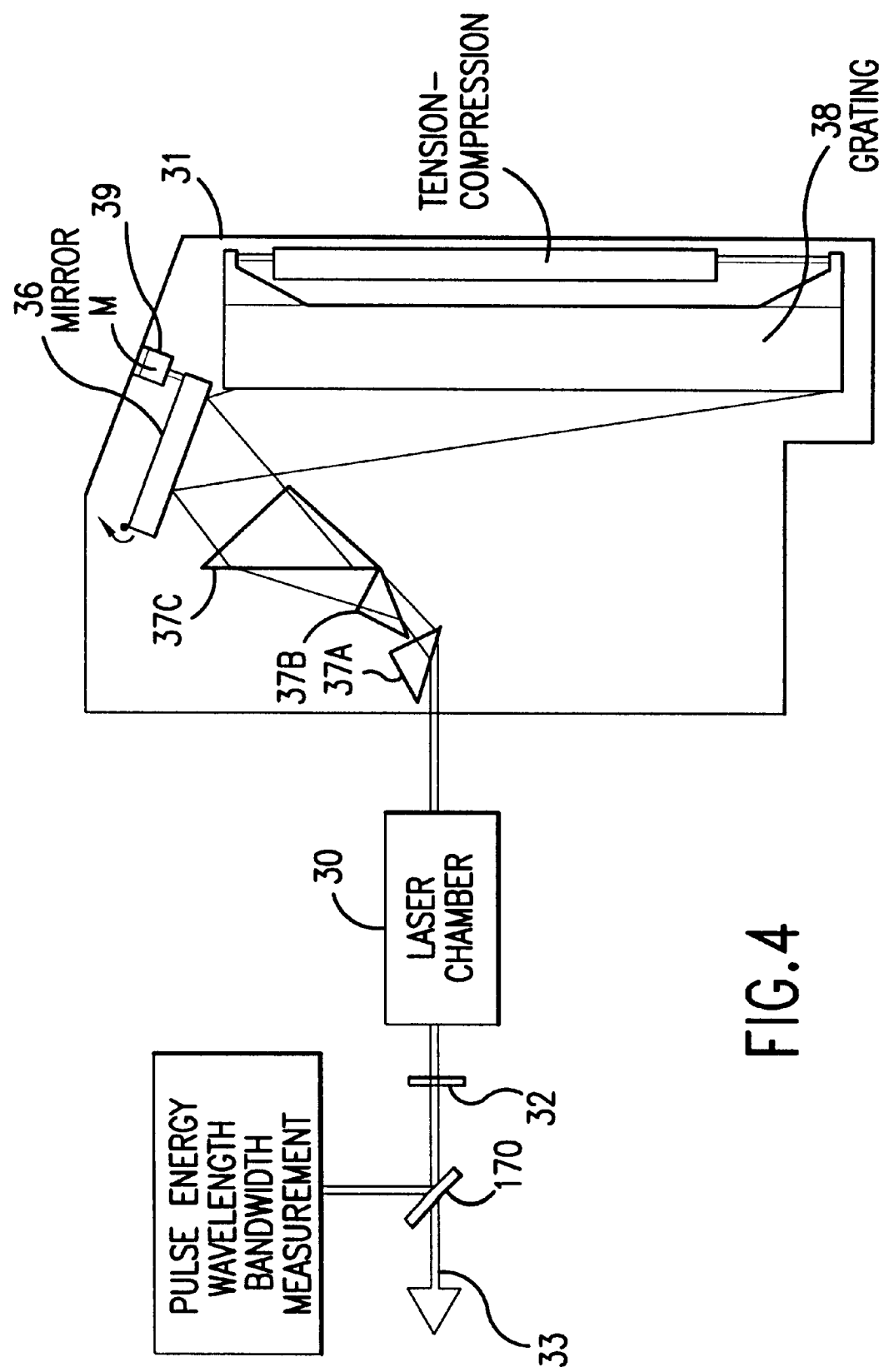
FIG. 4 is a block diagram showing the principal elements for controlling wavelength of an excimer laser.

As shown in FIG. 4, the laser 30 may be tuned to operate at any wavelength within the ArF broadband spectrum using tuning mirror 36 in line-narrowing module 31. In a preferred embodiment, the laser is tuned by pivoting mirror 36 with stepper motor 39 so as to slightly change the angle at which the laser beam (expanded by prisms 37A, 37B and 37C) is incident on grating 38. The relationship between wavelength and mirror position as measured by steps of stepper motor 39 is shown in FIG. 3 where one full step of the stepper motor produces a change of about 0.15 pm in the nominal narrowband output center wavelength. The stepper motor scan of a few millimeters is sufficient to scan the output wavelength of laser 30 throughout 500 pm tuning range from about 193,100 pm to about 193,600 pm. Note that the relationship between mirror position and wavelength is not exactly linear, but in the narrow tuning range of this laser, a linear relationship can be assumed and in this preferred embodiment linearity is not required.

Measuring Beam Parameters

Figure 10:
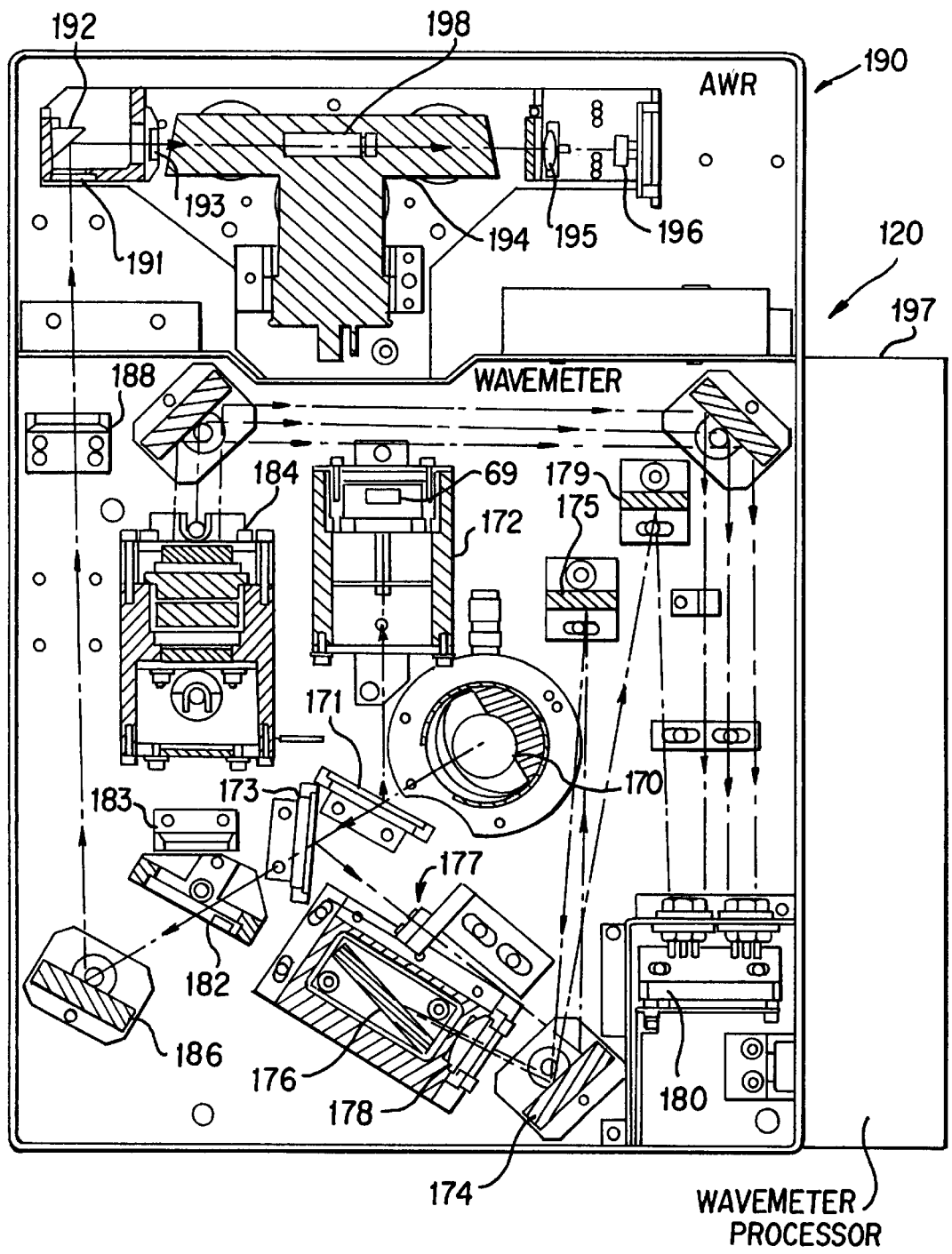
FIG. 10 shows a preferred layout of optical equipment for measuring wavelength of an ArF laser.

FIG. 10 shows the layouts of a preferred wavemeter unit 120 an absolute wavelength reference calibration unit 190, and a wavemeter processor 197.

The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor.

As shown in FIG. 10, the output beam from output coupler 32 (as shown in FIG. 4) intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 1000 per second. The pulse energy is about 5 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Coarse Wavelength Measurement

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, 175 and 174 again, and then is reflected from mirror 179 and focused onto the left side of 1024-pixel linear photo diode array 180. The spatial position of the beam on the photo diode array is a coarse measure of the relative nominal wavelength of the output beam.

Linear Photo Diode Array

Figure 5:
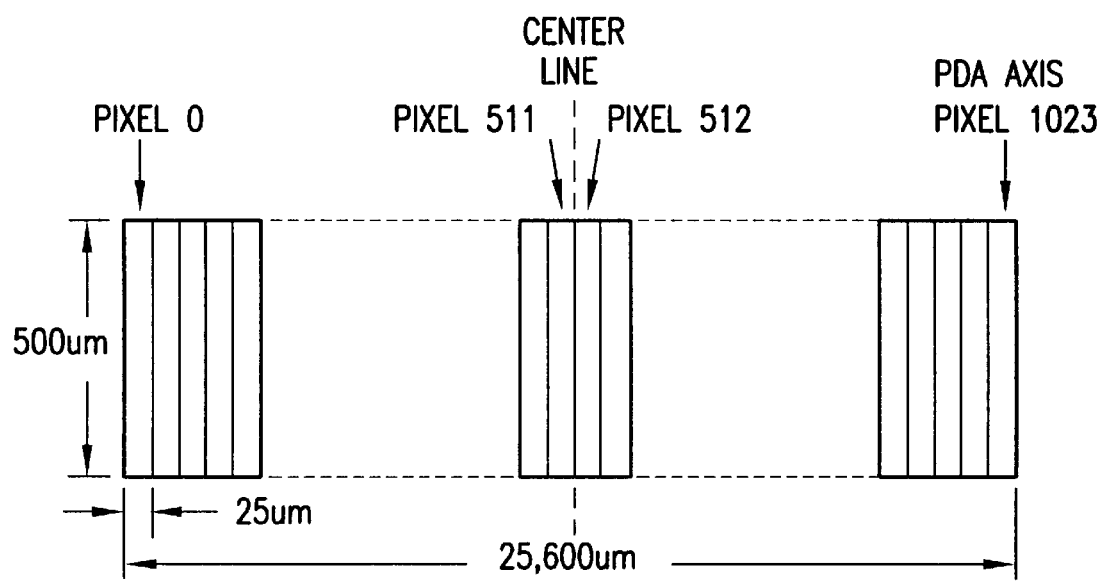
FIG. 5 depicts a 1024-pixel photo diode array.

Linear Photo diode array 180 is depicted in greater detail in FIG. 5. The array is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long.

Photo diode arrays such as this are available from several sources. A preferred supplier is Hamamatsu. In our preferred embodiment, we use a Model S3903-1024 which can be read at the rate of $2\times10^6$ pixels/sec on a FIFO basis in which complete 1024 pixel scans can be read at rates of 2000 Hz or greater.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 191{,}625 \text{ pm}$$

where P=coarse image central positions

Fine Wavelength Measurement

About 95% of the beam which passes through mirror 173 as shown in FIG. 10 is reflected off mirror 182 through lens 183 onto a diffuser at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 10.

The spectrometer must measure wavelength and bandwidth substantially in real time. Because the laser repetition rate may be 1000 Hz or higher, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 6:
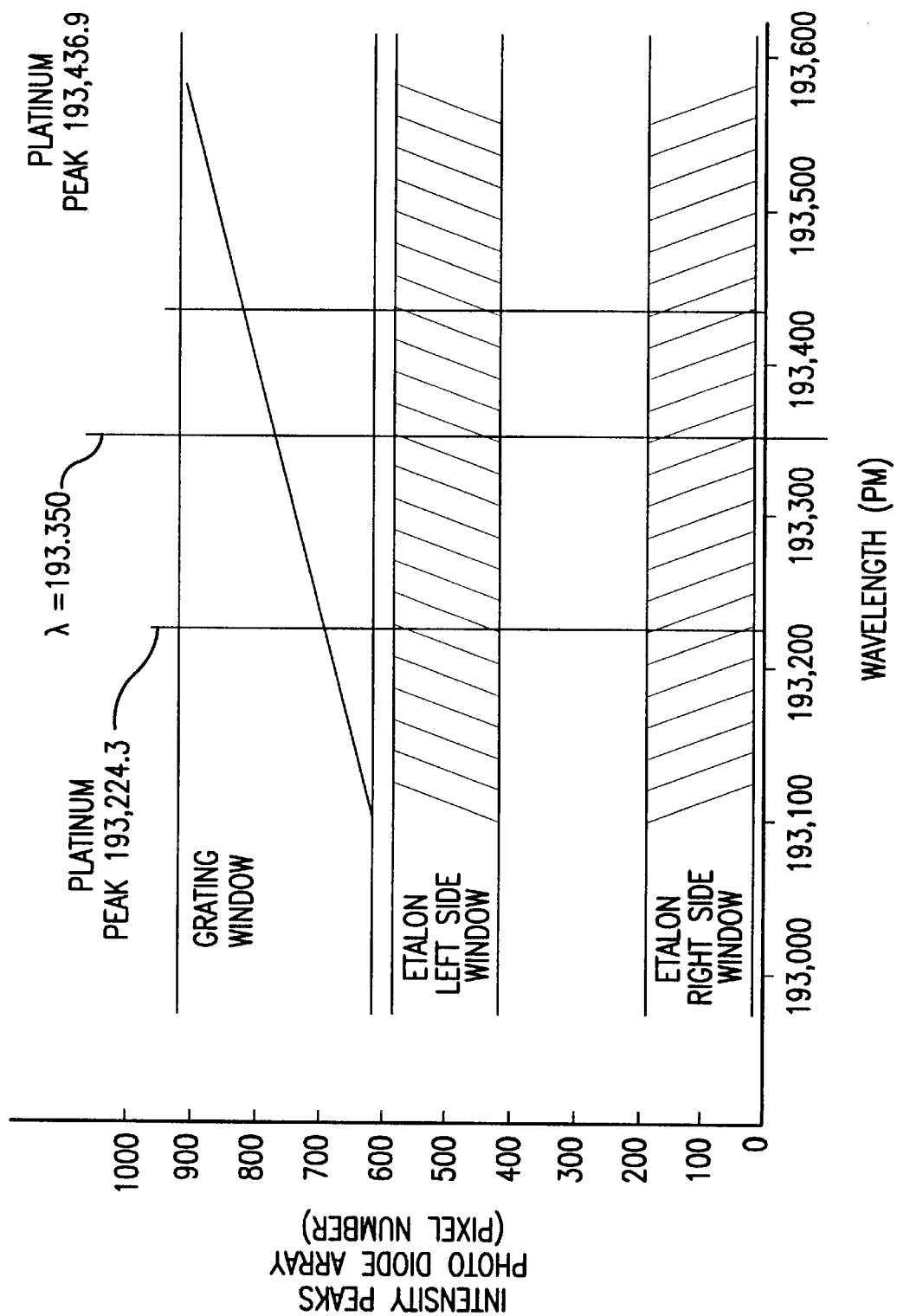
FIG. 6 describes the light patterns on the FIG. 5 photo diode array used for making coarse and fine wavelength measurements.
Figure 9A:
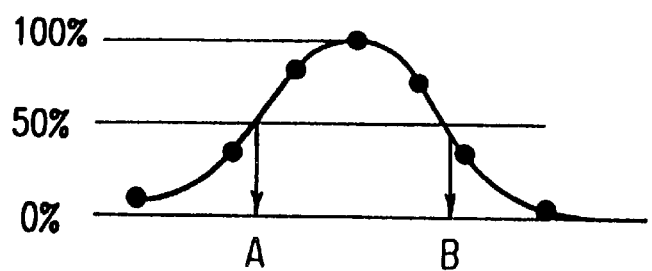
FIGS. 9A and 9B demonstrate how bandwidth and fringe diameters are measured using the output of the FIG. 5 photo diode.
Figure 9B:
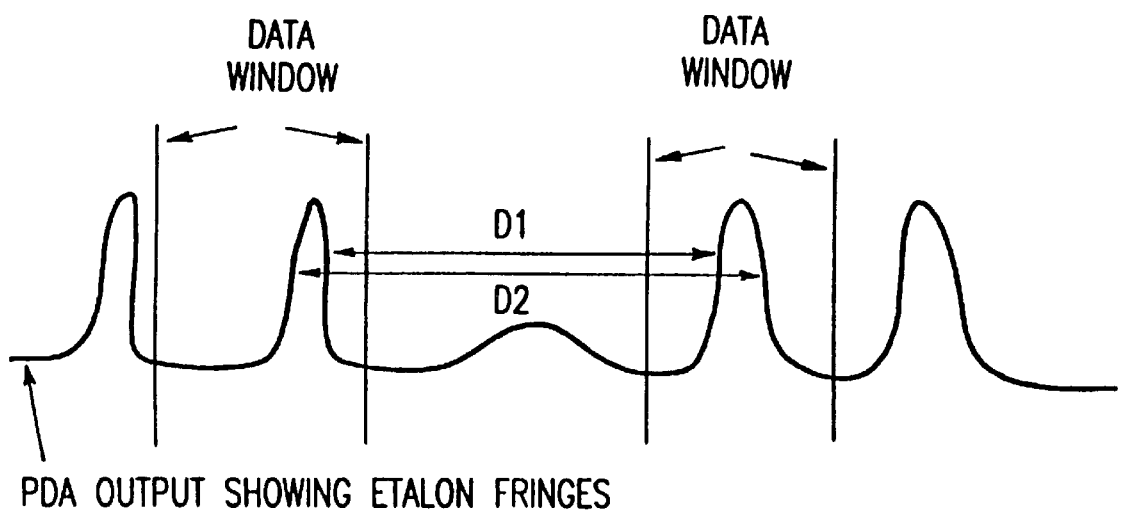

The specific details of a preferred algorithm used in this preferred embodiment will now be described. FIG. 9B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 9B. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 6.

The steps involved are as follows:
1. After a laser shot, the photo diode array output is electronically read out and digitized. Data points are separated by an interval physically determined by the spacing of the photo diode array elements, in this case 25 micrometer pitch.
2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
3. Based on the intensity of the peak, a 50% level is computed as shown in FIG. 9A. The 0% level is measured periodically between the pulses. Based on the computed 50% level, points are examined right and left of the peak until the data points which border the 50% level are found. A linear interpolation is computed between pairs of points, which border the 50% level to find the left and right half-maximum positions, labeled A, and B in FIG. 9A. These positions are computed to a fraction of a pixel such as $\frac{1}{16}$, using an integer data format.
4. Steps 2 and 3 are duplicated for the two data windows, giving a total of four interpolated 50% positions. As indicated FIG. 9B, two diameters are computed. D1 is the inner fringe diameter while D2 is the outer fringe diameter.
5. An approximation to the wavelength is determined by the coarse wavelength circuit, as described in the preceding section "Coarse Wavelength Measurement."

Fine Wavelength Calculation

The inner and outer fringe diameters D1 and D2 (in units of pixels) are each converted to wavelength by the following equations:

$$\lambda = \lambda_0 Cd(D^2 - D_0^2) + N \cdot FSR$$

where $\lambda$=wavelength corresponding to diameter D $\lambda_0$=calibration wavelength $D_0$=diameter corresponding to wavelength $\lambda_0$
Cd=calibration constant dependant on the optical design
FSR=free spectral range of the etalon
N=integer,=0,±1,±2,±3 . . .

The values $\lambda_0$, $K_1$, FSR, and $D_0$ are determined and stored at the time of calibration. The value for N is chosen such that:

$$|\lambda - \lambda_c| \leq \frac{1}{2} FSR$$

where $\lambda_c$=coarse wavelength determination.

For example, in a preferred embodiment, we select a reference wavelength $\lambda_0$=193,436.9 pm (corresponding to an absorption line of a platinum hollow cathode lamp). At this wavelength, the fringe diameter $D_0$ might be found to be 300 pixels. Cd is a constant which can either be directly measured or calculated from the optical design. In our preferred embodiment, Cd=$-9.25 \times 10^{-5}$ pm/pixel². Thus, for example, with the laser operating at a different wavelength, the fringe diameter may be measured to be 405 pixels. The possible wavelengths computed by equation (1) are:

$$\lambda = 193,436.9 \text{ pm} - 9.26 \times 10^{-5} \text{ pm/pixel}^2 [(405)^2 - (300)^2] + N \cdot FSR = 193,443.7 N \cdot FSR$$

If the free spectral range FSR=20 pm, then the possible values for $\lambda$ include:

| | |
|---|---|
| 193,403.7 pm | N = −2 |
| 193,423.7 | N = −1 |
| 193,443.7 | N = 0 |
| 193,463.7 | N = +1 |
| 193,483.7 | N = +2 |

If the coarse wavelength is determined to be $\lambda_c$=193, 401.9, for example, then the processor will select the value $\lambda$=193,403.7 pm (N=−2) as the solution in the closes agreement with $\lambda_c$.

The inner and outer fringe diameters $D_1$ and $D_2$ as shown in FIG. 9B are each converted into wavelengths $\lambda_1$ and $\lambda_2$, respectively. The final value which is reported for the laser wavelength is the average of these two calculations:

$$\lambda = \left( \frac{\lambda_1 + \lambda_2}{2} \right)$$

Bandwidth Calculation

The bandwidth of the laser is computed as $(\lambda_2 - \lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left( \frac{D_2 - D_1}{2} \right) - \Delta\lambda\epsilon$$

$\Delta\lambda\epsilon$ depends on both the etalon specifications and the true laser bandwidth. It typically lies in the range of 0.1–1 pm for the application described here.

Calibration with Atomic Reference Source

In this preferred embodiment, wavemeter 120 is calibrated with the optical equipment shown in atomic wave reference unit 190 as shown in FIG. 10.

Figure 12:
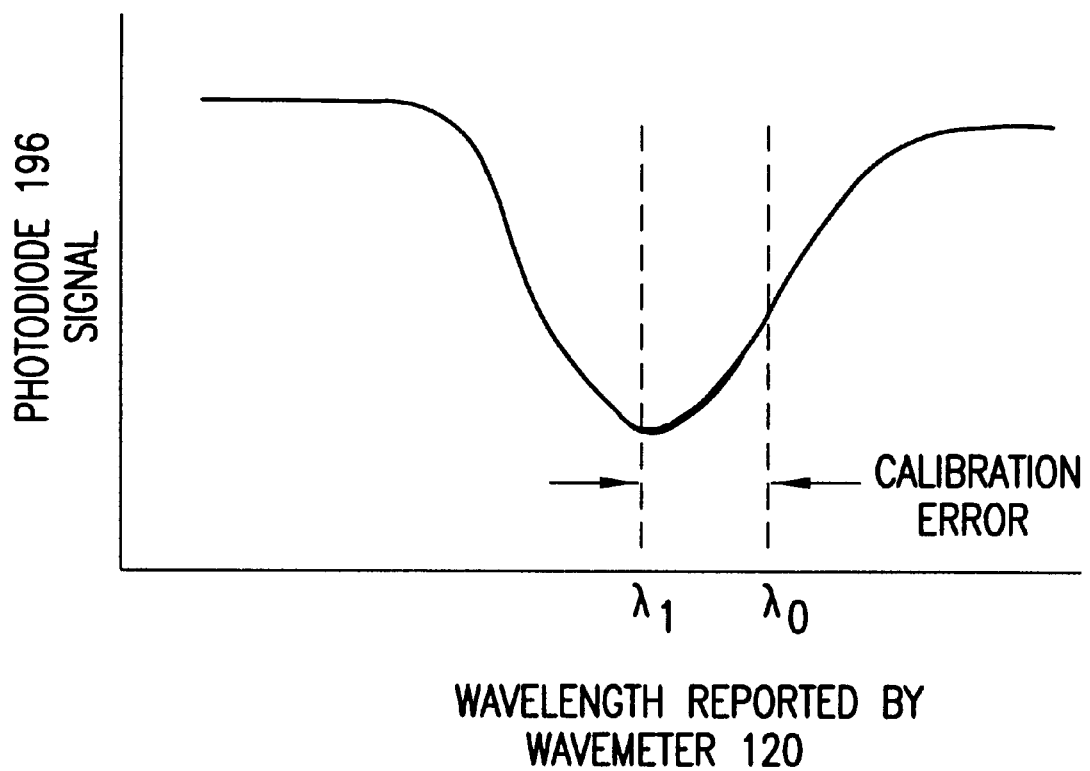
FIG. 12 is a graph showing absorption in the vapor cell.

The approximately 5% portion of the beam passing through mirror 182 is reflected from mirror 186 through lens 188 and into atomic wavelength reference unit 190. The light passes through diffuser 191, reflects off mirror 192 and is focused by lens 193 to a focal point in the center of vapor cell 194, and is focused again by lens 195 onto photo diode 196. Calibration is accomplished by scanning the wavelength of the laser (with tuning mirror 36 as shown in FIG. 4.) while keeping the output energy of the laser constant, as monitored and controlled by energy detector 69. In this preferred embodiment, the scanning and calibration sequence is automated and programmed into the control electronics for the laser. The wavelength range of the scan is chosen so as to include an absorption wavelength of the platinum vapor cell 194. For example, in this preferred embodiment, the strong absorption at 193,436.9 pm is used, and the laser is programmed to scan from about 193,434 pm to 193,440 pm. When the laser wavelength coincides with the absorption wavelength, a substantial reduction in signal (10–50%) is seen by the photo diode 196. During the scan, two corresponding sets of data are taken, the signal from the photo diode 196, and the wavelength as measured by the wavemeter 120. A representative set of data is shown in FIG. 12, where the signal from the photo diode 196 is plotted against the wavelength as reported by the wavemeter 120. The processor analyzes the photo diode data and determines the apparent wavelength $\lambda_1$ which corresponds to the center of the absorption dip. Since the true wavelength $\lambda_0$ of the atomic absorption reference is known with precision, the calibration error $(\lambda_1-\lambda_0)$ can be calculated. This error is then used to automatically correct the calibration constants used by both the coarse and fine wavelength algorithms.

Improved Etalon

Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

Figure 7A:
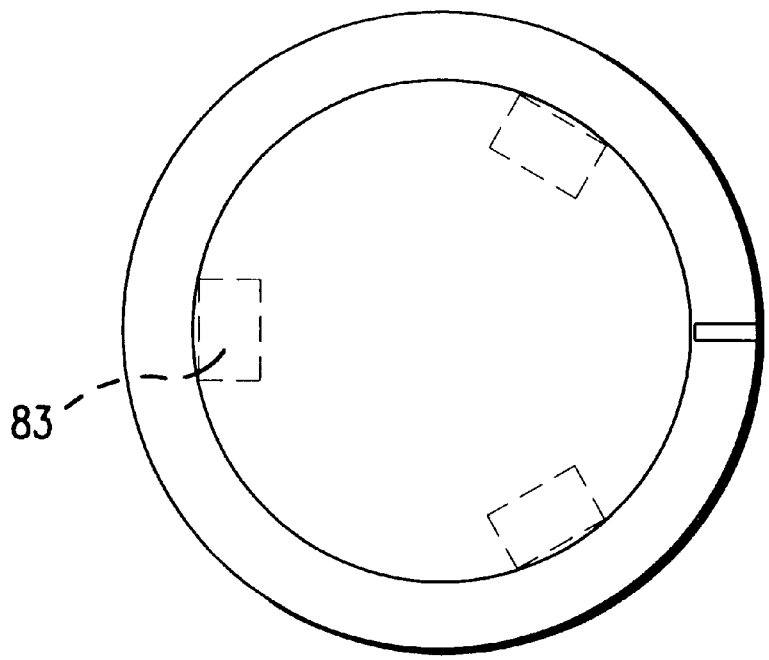
FIGS. 7A and 7B are views of an etalon.
Figure 7B:
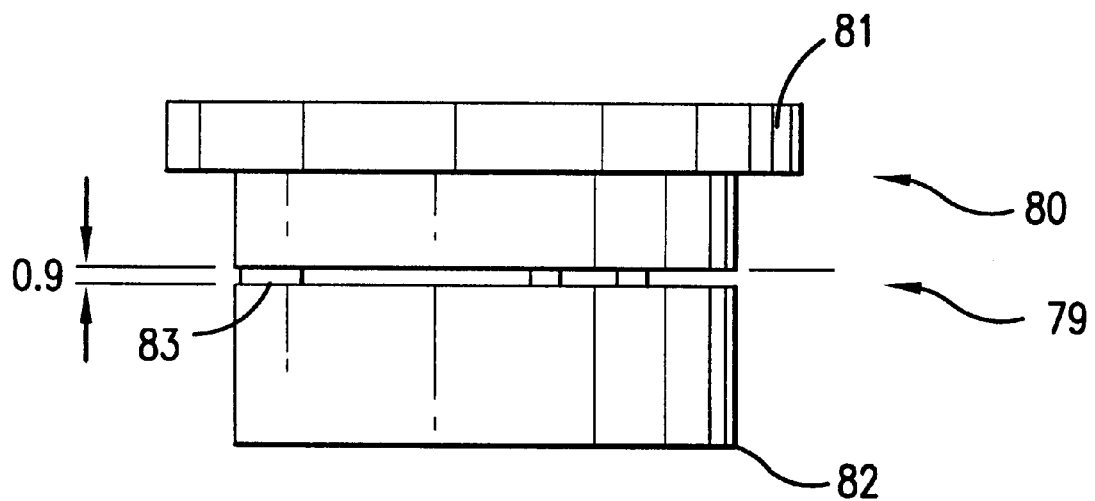
Figure 8:
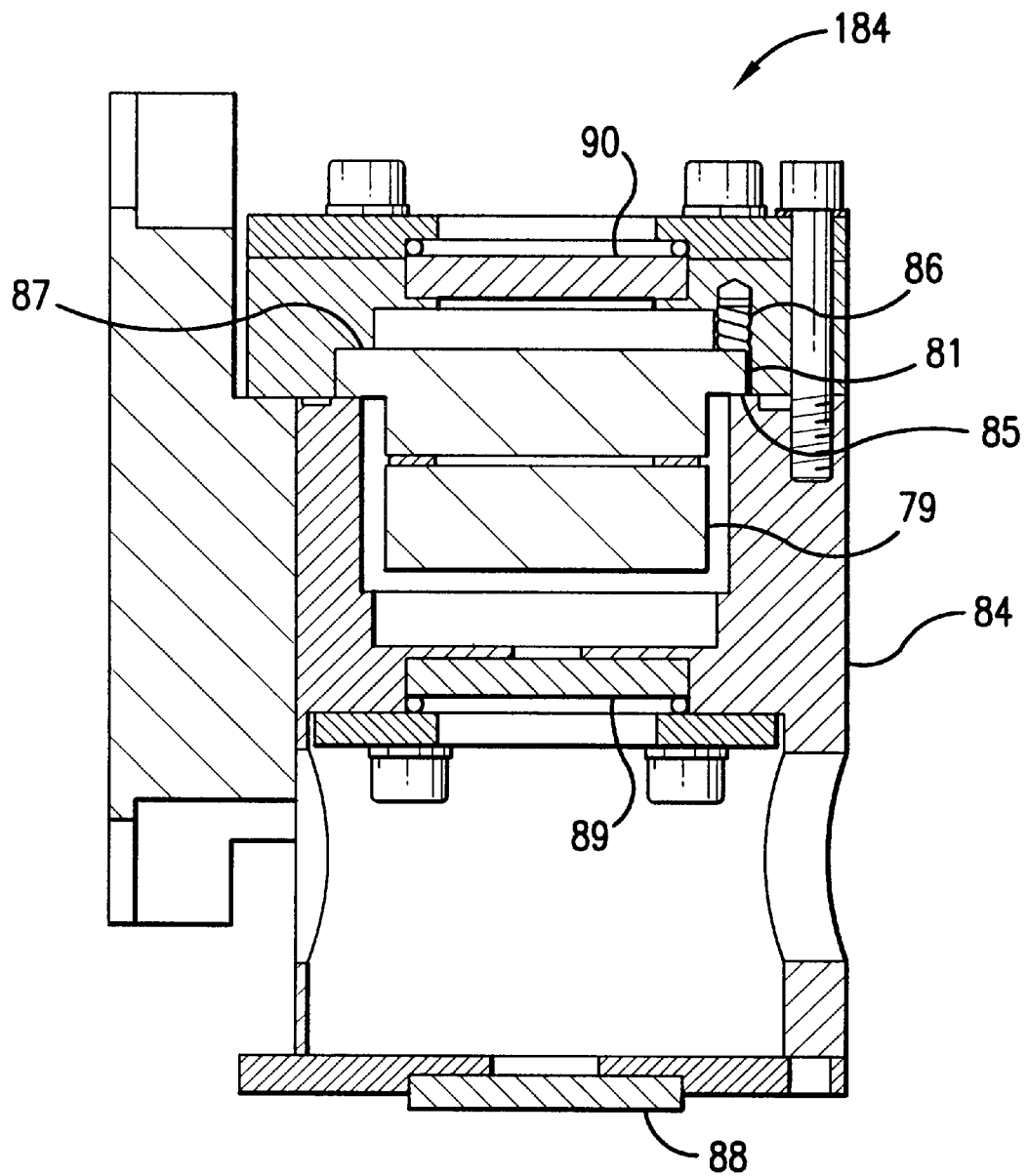
FIG. 8 is a drawing of an etalon assembly.

A preferred embodiment includes an improved etalon assembly shown at 184 in FIG. 10. In this etalon assembly is shown in detail in FIGS. 7A and 7B, the fused silica etalon 79 itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer±1 micrometer thick. These hold the etalon together by optical contact using a technique well known in the optics manufacturing art. The reflectance of the inside surfaces of the etalon are each about 88 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces. In an alternative embodiment a diffractive lens array is used as the diffuser 88. In this case a pattern is produced in the diffractive lens array which scatters the light thoroughly but only within an angle of about 5 degrees. The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 10% of prior art values with equivalent light on the photo diode array.

Platinum Vapor Cell

Figure 11:
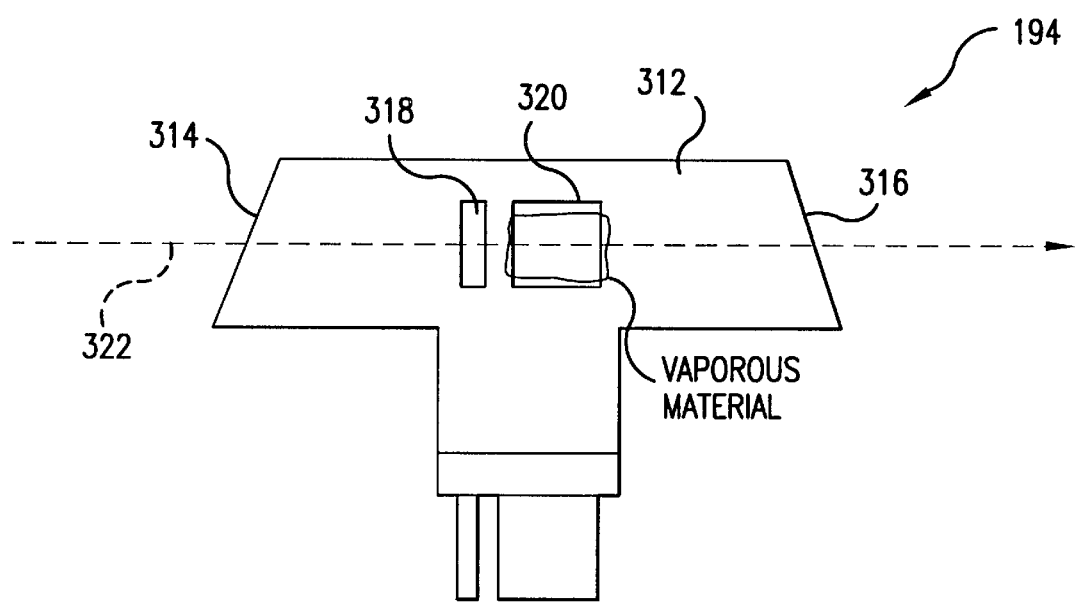
FIG. 11 is a drawing of a vapor cell.

Details of platinum vapor cell 194 are described by reference to FIG. 11. This cell is a modified series L2783 hollow cathode lamp tube similar to the one described in U.S. Pat. No. 5,450,202. A glass envelope with UV-transmitting windows 314 and 316 contains neutral gas, neon. The major difference is that the hollow cathode of the cell in this preferred embodiment comprises a very thin platinum "hollow T" shaped sleeve which covers the surface of the cathode 320 facing anode 318 and the inside surface of hollow cathode 320. A DC source of about 150 volts energizes the cell creating a plasma containing platinum ions which are generally contained within the hollow cathode as a vaporous material as shown in FIG. 11.

Other Preferred Embodiments

In another preferred embodiment of the system, the laser 30 at FIG. 4 contains fluorine gas ($F_2$) and is tunable through a range of wavelengths that includes 157.639 nm, and the absorption cell 194 contains a vapor including bromine atoms. The cell 194 may consist of a hollow cathode lamp as described above but with a cathode containing bromine.

Alternatively, other sealed containers with windows arranged for transmitting the beam to detector 196 could be used.

In another preferred embodiment of this invention, focusing element 193 may be used with a suitable aperture to allow a collimated portion of the beam to pass through the cathode 198, through optical element 195 and onto detector 196. In this embodiment, measures must be taken to avoid optical interference effects due to reflections from parallel surfaces of the windows in cell 194. Such measures might include providing a small wedge angle between the inner and outer window surfaces on both the entrance and exit windows of cell 194.

Since the platinum vapor provides two distinctive absorption lines within the tuning range of the ArF laser, both lines are available if needed to improve the accuracy of the calibration. Procedures could be established to use both lines on each calibration. But preferably the second line could be checked only occasionally if the occasional checks show the calibration at one line calibrates the laser accurately at the second line.

Other Techniques for Tuning the Laser

Tuning of laser 30 of FIG. 4 to a desired wavelength may be performed in various well known ways, which may be mechanically, optically, or chemically (by controlling the gas components within laser 30), although tuning the laser optically, as shown in FIG. 4, is preferred. Any of these known mechanisms for tuning a laser in response to a control signal may constitute the wavelength adjustment mechanism.

Although a specific structure is shown for detecting platinum absorption lines other suitable embodiments may be employed. These may be implemented using different optical setups, as would be understood by those skilled in the art after reviewing this disclosure.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A wavelength system for measuring and controlling wavelength of a laser beam produced by a narrowband laser, said system comprising:

A. a wavemeter for measuring incremental changes in wavelength;

B. an atomic wavelength reference for calibrating said wavemeter, said reference comprising:
   1) a vapor cell for containing a vapor having an absorption line near a desired operating wavelength for said laser; and
   2) a calibration light detector for measuring intensity of light passing through said vapor cell;

C. a tuning device having a tuning range sufficient to tune said laser to a range of wavelength encompassing said absorption line;

D. an optical train arranged to simultaneously direct portions of said narrow band laser beam (i) to said wavemeter; and (ii) through said vapor cell to said calibration light detector; and E. a processor for collecting and analyzing data from said calibration light detector and said wavemeter over said range of wavelengths and, based on such analysis, calibrate said wavemeter.

2. A wavemeter system as in claim 1 and further comprising a pulse energy detector for measuring pulse energy of said narrowband laser beam.

3. A wavelength system as in claim 1 wherein said wavemeter comprises a photo diode array, a grating subsystem for providing a coarse wavelength indication on a first section of said photo diode array and an etalon subsystem for providing a fine wavelength indication on a second section of said photo diode array.

4. A wavelength system as in claim 1 wherein said laser is an ArF excimer laser and said vapor comprises platinum vapor.

5. A wavelength system as in claim 4 wherein said absorption line is chosen from a group of platinum absorption lines consisting of a 193,224.3 pm line and a 193,436.9 pm line.

6. A wavelength system as in claim 1 wherein said wavemeter comprises an etalon assembly comprising an etalon comprising a first glass plate having a support flange and a second glass plate said first glass plate being supported by said flange and said second glass plate being supported by a plurality of thin spacers attached to said first glass plate.

7. A wavelength system as in claim 6 wherein said flange is supported by the three pads mounted on a support structure.

8. A wavelength system as in claim 1 wherein said tuning device comprises a grating.

9. A wavelength system as in claim 8 and further comprising a tuning mirror.

10. A wavelength system as in claim 8 and further comprising a pivot means for pivoting said grating.

11. A wavelength system as in claim 1 wherein said laser is an $F_2$ excimer laser and said vapor comprises bromine vapor.

12. A wavelength system as in claim 12 wherein said absorption line is at 157,639 pm.

13. A laser system comprising:

a tunable excimer laser for outputting a laser beam;

a gas cell containing one or more gases that have a plurality of absorption lines in a tuning range of interest, at least a portion of said laser beam passing through said gas cell;

a wavelength adjustment mechanism connected to said laser;

a wavemeter receiving at least a portion of said laser beam for detecting a wavelength of said laser; and a processor programmed for detecting a dip in the energy of said laser beam passing through said gas cell to determine a wavelength or a narrow band of wavelengths of said laser beam which matches a wavelength of an absorption line of said one or more gases in said gas cell and for calibrating said wavemeter to at least one of said absorption lines of said one or more gases.

* * * * *